(12) United States Patent
Peterson et al.

(10) Patent No.: US 10,497,352 B2
(45) Date of Patent: Dec. 3, 2019

(54) INFORMATION HANDLING SYSTEM WITH AN ACOUSTICAL BAFFLE

(71) Applicant: DELL PRODUCTS, LP, Round Rock, TX (US)

(72) Inventors: Chris E. Peterson, Austin, TX (US); Tsung-Ping Chen, Taipei (TW); Brandon Joel Brocklesby, Pflugerville, TX (US); Paul Waters, Austin, TX (US); Richard Eiland, Austin, TX (US); Richard Guzman, Austin, TX (US)

(73) Assignee: Dell Products, LP, Round Rock, TN (US)

( * ) Notice: Subject to any disclaimer, the term of this patent is extended or adjusted under 35 U.S.C. 154(b) by 151 days.

(21) Appl. No.: 15/860,184

(22) Filed: Jan. 2, 2018

(65) Prior Publication Data

US 2019/0206379 A1 Jul. 4, 2019

(51) Int. Cl.
*G10K 11/162* (2006.01)
*H05K 7/14* (2006.01)
*H05K 7/20* (2006.01)

(52) U.S. Cl.
CPC ......... *G10K 11/162* (2013.01); *H05K 7/1487* (2013.01); *H05K 7/20727* (2013.01); *H05K 7/20145* (2013.01)

(58) Field of Classification Search
CPC ............... G10K 11/162; H05K 7/1487; H05K 7/20145; H05K 7/20727

USPC ..................................................... 361/679.51
See application file for complete search history.

(56) References Cited

U.S. PATENT DOCUMENTS

| | | | | |
|---|---|---|---|---|
| 6,646,876 B2 * | 11/2003 | Carr | ........................ | G06F 1/181 361/679.33 |
| 7,431,127 B2 * | 10/2008 | de Borchgrave | ..... | F04D 29/664 123/198 E |
| 7,909,135 B2 * | 3/2011 | Furuya | .................. | F24F 5/0042 181/212 |
| 7,986,526 B1 * | 7/2011 | Howard | ............... | H05K 7/1488 181/200 |
| 2006/0185931 A1 | 8/2006 | Kawar | | |
| 2017/0127562 A1 * | 5/2017 | Huang | ...................... | G06F 1/20 |

* cited by examiner

*Primary Examiner* — Jacob R Crum
(74) *Attorney, Agent, or Firm* — Larson Newman, LLP

(57) ABSTRACT

An acoustical baffle includes a baffle housing, a lens, an acoustic foam, and a retaining mesh. The baffle housing includes a front panel having a channel, and first and second side panels. The first side panel is placed in physical contact with a first panel of a server chassis, and the second side panel is placed in physical contact with a second panel of the server chassis. The lens is in physical contact with the baffle housing, and fits within the channel of the front panel. The acoustic foam is in physical contact with the baffle housing, and includes an acoustic surface to absorb noise generated by cooling fans within the server chassis. The retaining mesh is in physical contact with the acoustic foam, and holds the acoustic foam within the acoustical baffle.

20 Claims, 5 Drawing Sheets

INFORMATION HANDLING SYSTEM WITH AN ACOUSTICAL BAFFLE

FIELD OF THE DISCLOSURE

The present disclosure generally relates to information handling systems, and more particularly relates to an information handling system with an acoustical baffle.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An acoustical baffle includes a baffle housing, a lens, an acoustic foam, and a retaining mesh. The baffle housing includes a front panel having a channel, and first and second side panels. The first side panel may be placed in physical contact with a first panel of a server chassis, and the second side panel may be placed in physical contact with a second panel of the server chassis. The lens may be in physical contact with the baffle housing, and may fit within the channel of the front panel. The acoustic foam may be in physical contact with the baffle housing, and may include an acoustic surface to absorb noise generated by cooling fans within the server chassis. The retaining mesh may be in physical contact with the acoustic foam, and may hold the acoustic foam within the acoustical baffle.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
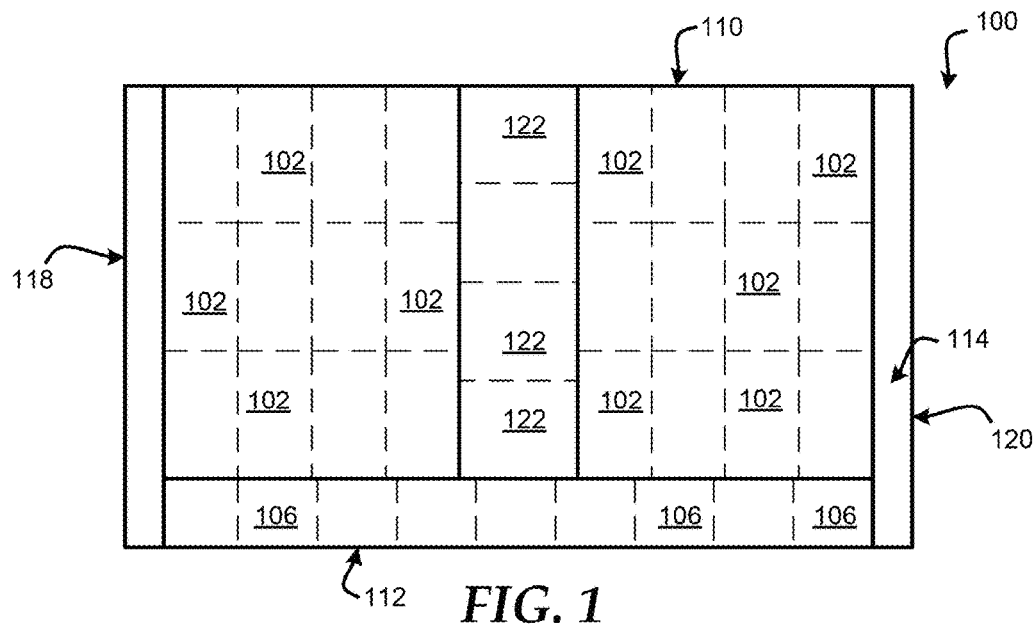
FIG. 1 is a block diagram of a front panel of a server chassis according to at least one embodiment of the present disclosure.
Figure 2:
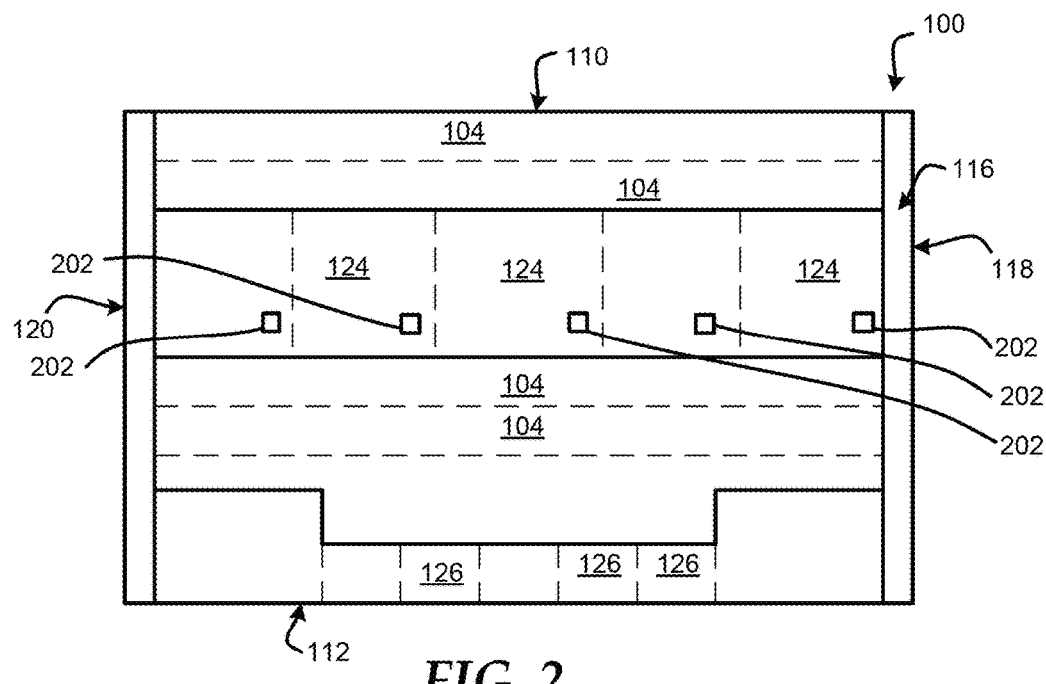
FIG. 2 is a block diagram of a rear panel of the server chassis according to at least one embodiment of the present disclosure.

FIGS. 1 and 2 show a chassis 100 to hold multiple information handling systems, such as compute devices 102, input/output (I/O) devices 104, and power supply units 106. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The chassis includes a top panel 110, a bottom panel 112, a front panel 114, a back panel 116, and side panels 118 and 120. The components and devices accessed through the front panel 114 the chassis 100 include multiple compute devices 102, power supply units 106, and fans 122. In an embodiment, the compute devices 102 can be peripheral devices, such as storage devices, peripheral component interconnect express (PCIe) devices, or the like. In an embodiment, the compute devices 102 can utilize most of the space of the front panel 114 except where the power supply units 106 stack horizontally across the bottom of the front panel 114 adjacent to the bottom panel 112, and the fans 122 extend vertically down the center of the front panel from the top panel 110 to the top of the power supply units 106.

The components and devices located within the back panel 116 the chassis 100 include multiple I/O devices 104, a first group of fans 124. In an embodiment, a first portion of the I/O devices 104 can be oriented horizontally across the top of the back panel 116. The fans 124 can be located in a horizontal row below the first portion of I/O devices 104 within the back panel 116, and a second portion of the I/O devices 104 can be located in a horizontal row below the fans 124 within the back panel 116.

In an embodiment, each the power supply units 106 includes fan within the power supply unit itself. In this embodiment, the back panel 116 includes exhaust ports 126 to expel air from the fans of the power supply units 106. In another embodiment, the fans within the power supply units 106 may be moved to the exhaust ports 126 without varying from the scope of the disclosure.

Figure 3:
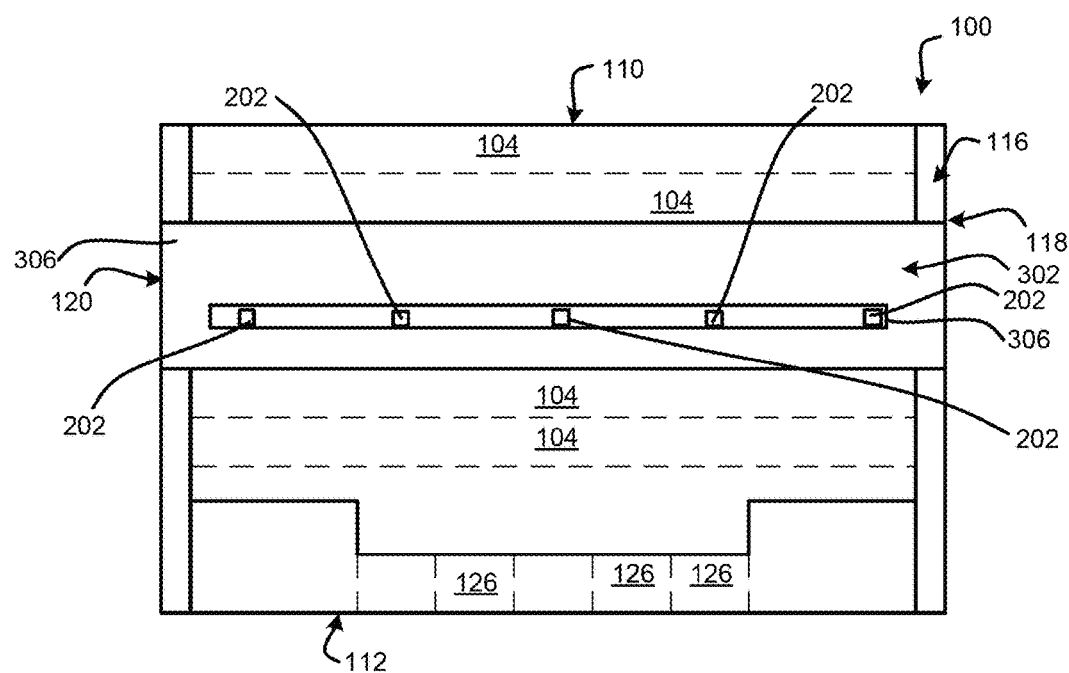
FIG. 3 is a block diagram of the rear panel of the server chassis including an acoustical baffle according to at least one embodiment of the present disclosure.

In an embodiment, the compute devices 102 are divided into two vertically oriented portions within the front panel 114, and these two vertically oriented portions connect with horizontally oriented fans 124 within the back panel 116. The fans 124 pull air from the front panel 114 across the compute devices 102 and out the back panel 116 to provide cooling of only the compute devices 102. The fans 122 in the front panel are vertically oriented, and the vertically oriented fans 122 push air through the chassis and to both of the horizontally oriented sections of the I/O device 104 within the back panel 116. Thus, the fans 122 provide cooling air to the I/O modules 104 without the air traveling past other components of the chassis 100. In an embodiment, each of the fans 124 includes a respective light emitting diode (LED) 202, which can provide a visual status indicator for the fan to a user of the server chassis 100. During operation of the components within the server chassis 100, the fans 124 can generate very noticeable sound power levels having an overall loudness factor to decrease a user experience when the user is near the server chassis 100. Thus, an acoustical baffle 302, as shown in FIG. 3, can be placed in physical contact with the back panel 116 and the side panels 118 and 120 to reduce noise emissions from the fans 124. In different embodiments, the acoustical baffle 302 can be a solid wall baffle, a vented baffle, or the like.

FIG. 3 shows the rear panel 116 of the server chassis 100 including the acoustical baffle 302 according to at least one embodiment of the present disclosure. The acoustical baffle 302 can snap fit on the back panel 116 and the side panel 118, and can also snap fit on the back panel 116 and the side panel 120. In an embodiment, the snap fit of the acoustical baffle 302 can securely place the acoustical baffle 302 in physical contact with the server chassis 100. The acoustical baffle 302 can cover the cooling fans 124 within the back panel to reduce the noise emissions produced by the cooling fans 124. The acoustical baffle 302 includes a baffle housing 304, which in turn has a channel 306.

In an embodiment, the channel 306 can provide line-of-sight through the acoustical baffle 302 to the back of the cooling fans 124, such that the LEDs 202 remain visible by a user while the acoustical baffle 302 is connected to the server chassis 100. In this embodiment, the user can continue to see the visual indicator LEDs 202 during operation of the cooling fans 124 without the acoustical baffle being removed. In an embodiment, the height of the baffle housing 304 can be substantially equal to the height of the cooling fans 124 so that the acoustical baffle 302 does not impede cable routing to the other components, such as the I/O devices 104, within the back panel 116 of the server chassis 100. In an embodiment, an acoustical baffle can also be placed over the cooling fans 122 within the front panel 114 of the server chassis 100. In this embodiment, the acoustical baffle on the front panel 114 can be substantially similar to the acoustical baffle 302. Thus, for brevity the description of the acoustical baffle will only be discussed with respect to the acoustical baffle 302.

Figure 4:
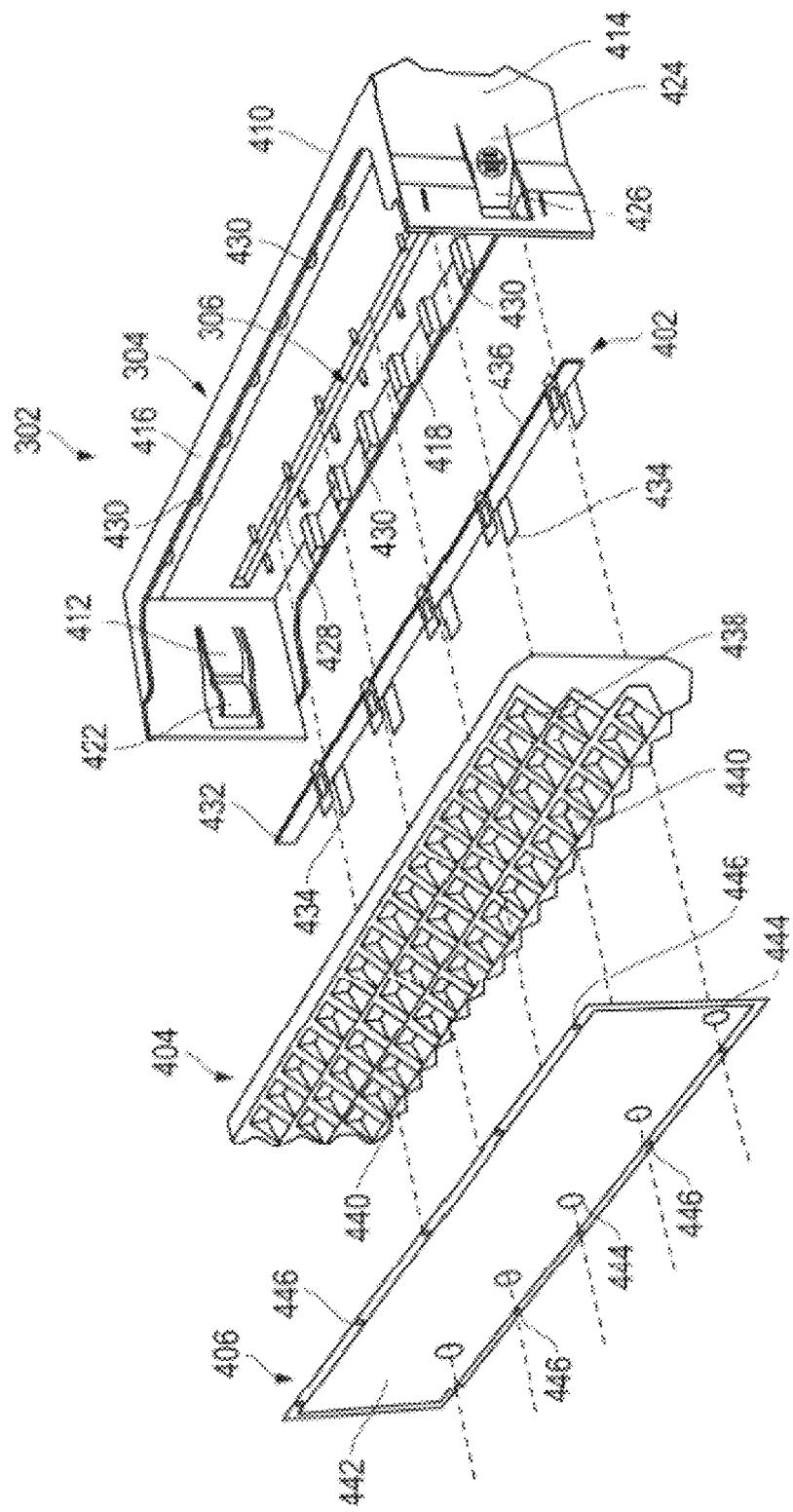
FIG. 4 is an exploded perspective view of the acoustical baffle according to at least one embodiment of the present disclosure.
Figure 5:
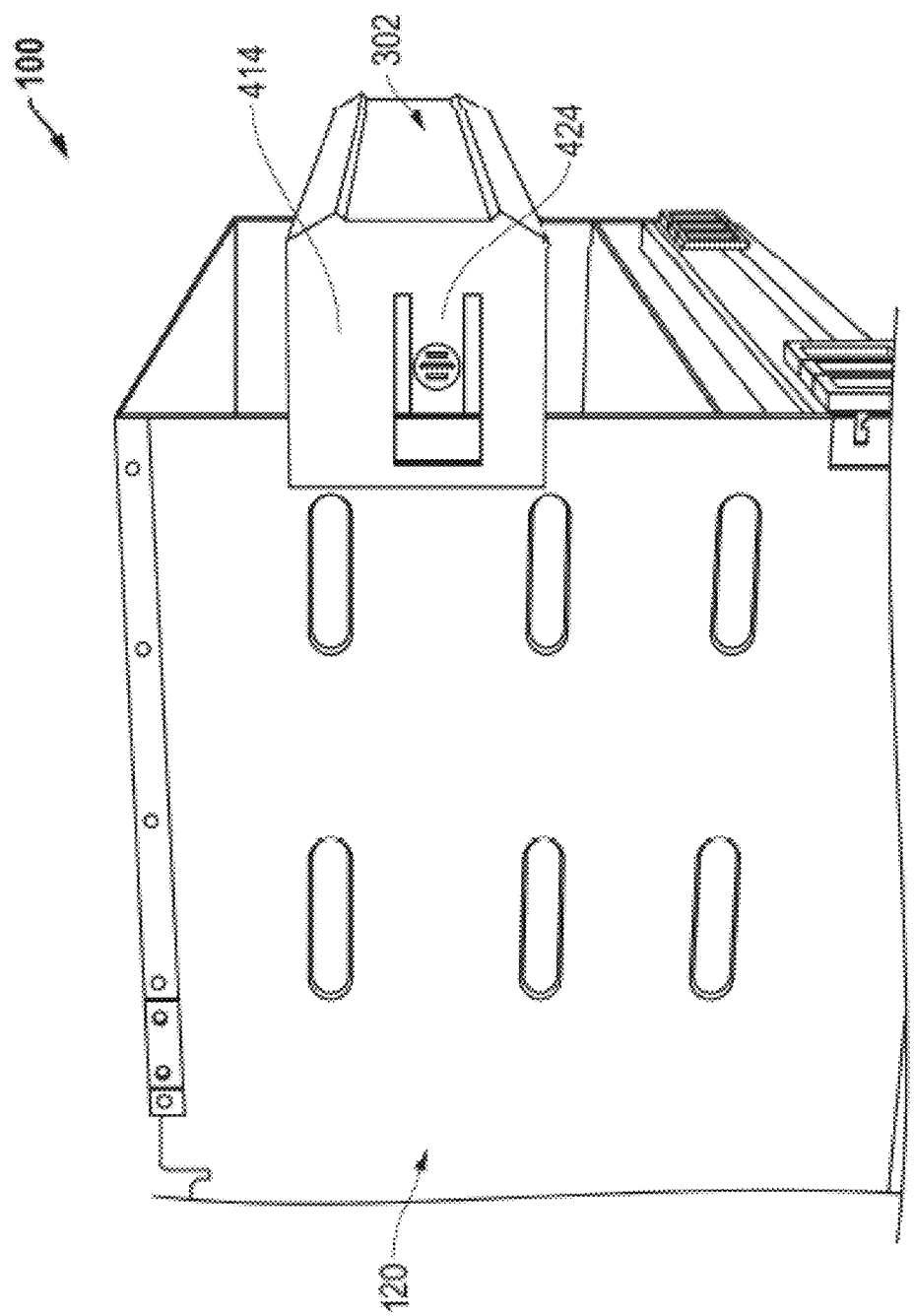
FIG. 5 is a perspective side view of the server chassis with the acoustical baffle connected to a side panel according to at least one embodiment of the present disclosure.

FIG. 4 shows an exploded view of the acoustical baffle 302 according to at least one embodiment of the present disclosure. The acoustical baffle 302 includes the baffle housing 304, a lens 402, an acoustic foam 404, and a retaining mesh 406. The baffle housing 304 includes a front panel 410, side panels 412 and 414, a top panel 416, and a bottom panel 418. The side panel 412 includes a tab 420 that is located within an opening of the side panel 412 and extends away from the front panel 410. The tab 420 includes a hook 422 that can snap fit on the side panel 118 of the server chassis 100 to hold the side panel 118 in between the hook 422 and the side panel 412 of the baffle housing 304. In an embodiment, the snap fitting of the hook 422 on the side panel 118 can securely hold the baffle housing 304 to the server chassis 100. The side panel 414 includes a tab 424 that is located within an opening of the side panel 414 and extends away from the front panel 410. The tab 424 includes a hook 426 that can snap fit on the side panel 120 of the server chassis 100 to hold the side panel 120 in between the hook 426 and the side panel 414 of the baffle housing 304, as shown in FIG. 5. In an embodiment, the snap fitting of the hook 426 on the side panel 120 can securely hold the baffle housing 304 to the server chassis 100. The acoustical baffle 302 can be removed from the server chassis 100 in response to a force being applied to the tabs 420 and 424 to release the hooks 422 and 426 from the respective side panels 120 and 118 of the server chassis 100. In an embodiment, the tabs 420 and 424 and the hooks 422 and 426 can enable the acoustical baffle 302 to be a tool less attachment to the back panel 116 of the server chassis 100, such that the acoustical baffle 302 can be easily attached and removed to provide quick access to the cooling fans 124.

In an embodiment, the baffle housing 304 also includes multiple pegs 428, located along a length of the channel 306, which can be utilized to connect the lens 402 with the baffle housing 304. In an embodiment, the baffle housing 304 also includes hooks 430 located along the top panel 416 and the bottom panel 418. In an embodiment, the hooks 430 can snap fit with the retaining mesh 406.

The lens 402 includes a main portion 432, multiple spacers 434, and catches 436. The acoustic foam 404 includes a sound dampening surface 438 and multiple openings 440. The retaining mesh 406 includes a mesh member 442, multiple openings 444, and multiple retaining openings 446. When the acoustical baffle 302 is assembled, the lens 402 can be placed in physical contact with the front panel 410 of the baffle housing 304. In this configuration, the main portion 432 is inserted within the channel 306 of the baffle housing 304, and the catches 436 can connect with the pegs 428 to mount the lens 304 on the baffle housing 304. In an embodiment, the spacers 434 can be inserted through the openings 440 of the acoustic foam 404 and the openings 444 of the retaining mesh 406. In an embodiment, the spacers 432 can be utilized to ensure that any light produced by the LEDs 202 of the cooling fans 124 can pass through the acoustical baffle 302 without being blocked by the retaining mesh 406 or the acoustic foam 404.

In an embodiment, the dampening surface 438 of the acoustic foam 404 can be designed to dampen the noise produced by the cooling fans 124 in a manner known to one of ordinary skill in the art. The retaining mesh 406 can be connected to the baffle housing 304 via the hooks 430 of the baffle housing 304 snap fitting within the retaining openings 440 of the retaining mesh 406. In an embodiment, the length of the hooks 430 can be a particular length to hold the mesh member 442 of the retaining mesh 406 a predetermined distance from the front panel 410 of the baffle housing 304. In an embodiment, the mesh member 442 can allow noise emissions from the cooling fans 124 to pass through the retaining mesh 406, such that the sound dampening surface 438 of the acoustic foam 404 can absorb additional noise without the noise being blocked by the retaining mesh 406.

Figure 6:
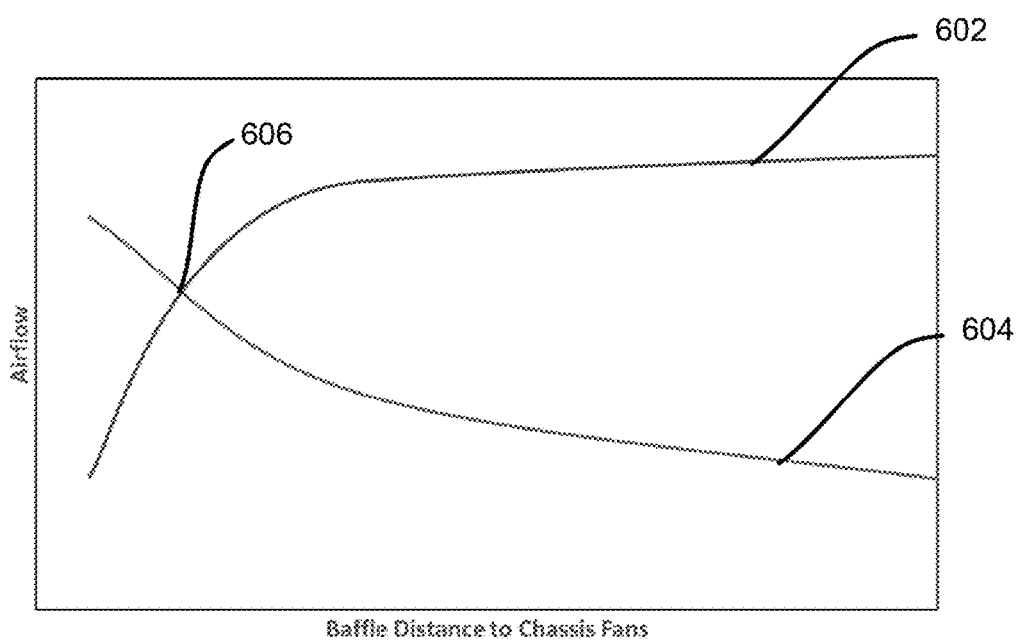
FIG. 6 illustrates a graph representing air flow through the server chassis based on a distance the acoustical baffle is from cooling fans of the server chassis according to at least one embodiment of the present disclosure.

Referring now to FIG. 6, an amount of air flow through the server chassis 100 can be different for the compute devices 102 and cooling fans 124 (compute device air flow), and for the I/O modules 104 and the cooling fans 122 (IOM air flow) based on a distance the acoustical baffle 302 is from cooling fans 124 of the server chassis 100 according to at least one embodiment of the present disclosure. The graph in FIG. 6 illustrates an amount of compute device air flow represented by line 602, and an amount of IOM air flow represented by line 604. In an embodiment, the amount of compute device air flow, line 602, increases as the distance between the acoustical baffle 302 and the cooling fans 124 increases. In an embodiment, the compute device air flow, line 602, decreases as the acoustical baffle 302 moves closer to the cooling fans 124 due to a higher back pressure on the cooling fans 124. However, the amount of IOM air flow, line 604, decreases as the distance between the acoustical baffle 302 and the cooling fans 124 increases. In an embodiment, the IOM air flow, line 604, increases as the acoustical baffle 302 moves closer to the cooling fans 124 based on the configuration of air channels within the server chassis 100.

Thus, a particular distance between the acoustical baffle 302 and the cooling fans 124 can be selected to meet optimal requirements of a particular server chassis. For example, in a particular embodiment, the particular distance between the acoustical baffle 302 and the cooling fans 124 can an optimization of the two air flows as represented by a point 606 where the lines 602 and 604 intersect. This particular distance can minimize air flow impact for the cooling fans 124 while improving air flow performance of the cooling fans 122. In an embodiment, this particular distance can be 60 mm. However, in different embodiments, the particular distance can change based on different configurations of the server chassis 100 without varying from the scope of this disclosure. In different embodiments, the requirements of the server chassis may differ, such that the particular distance between the acoustical baffle 302 and the cooling fans 124 can optimize the requirement for each particular server chassis.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An acoustical baffle comprising:
   a baffle housing including a front panel having a channel, and first and second side panels, the first side panel to be placed in physical contact with a first panel of a server chassis, and the second side panel to be placed in physical contact with a second panel of the server chassis;
   a lens in physical contact with the baffle housing, the lens to fit within the channel of the front panel;
   an acoustic foam in physical contact with the baffle housing, the acoustic foam including an acoustic surface to absorb noise generated by cooling fans within the server chassis; and
   a retaining mesh in physical contact with the acoustic foam, the retaining mesh to hold the acoustic foam within the acoustical baffle.

2. The acoustical baffle of claim 1, the lens includes a spacer to extend through the acoustic foam and the retaining mesh, the spacer to provide a line-of-sight from the front panel of the baffle housing to a light emitting diode on a first cooling fan within the server chassis.

3. The acoustical baffle of claim 1, the baffle housing further including:
   a first tab within a first opening of the first side panel, the first tab to extend away from the front panel; and
   a first hook at an end of the first tab opposite the front panel, the first hook to snap fit on the first panel of the server chassis to securely connect the acoustical baffle to the server chassis.

4. The acoustical baffle of claim 3, the baffle housing further including:
   a second tab within a second opening of the second side panel, the second tab to extend away from the front panel; and
   a second hook at an end of the second tab opposite the front panel, the second hook to snap fit on the second panel of the server chassis to securely connect the acoustical baffle to the server chassis.

5. The acoustical baffle of claim 4, wherein the first and second tabs and the first and second hooks enable the acoustical baffle a tool less attachment to and removal from the server chassis.

6. The acoustical baffle of claim 1, the baffle housing includes a peg to be placed in physical contact with a catch of the lens, wherein the physical contact between the peg and the catch hold the lens within the channel of the front panel.

7. The acoustical baffle of claim 1, the baffle housing includes a hook to be placed in physical contact with a retaining opening of the retaining mesh, wherein the physical contact between the hook and the retaining opening holds the retaining mesh a particular distance from the front panel.

8. The acoustical baffle of claim 1, wherein the retaining mesh is a particular distance from the cooling fans when the acoustical baffle is connected to the server chassis, wherein the particular distance optimizes air flow within the server chassis.

9. An information handling system comprising:
a server chassis including first and second panels, a plurality of cooling fans, and a plurality of compute devices cooled by the cooling fans; and
an acoustical baffle to be placed in physical contact with the server chassis, the acoustical baffle including:
a baffle housing including a front panel having a channel, and first and second side panels, the first side panel to be placed in physical contact with the first panel of the server chassis, and the second side panel to be placed in physical contact with the second panel of the server chassis;
a lens in physical contact with the baffle housing, the lens to fit within the channel of the front panel;
an acoustic foam in physical contact with the baffle housing, the acoustic foam including an acoustic surface to absorb noise generated by cooling fans within the server chassis; and
a retaining mesh in physical contact with the acoustic foam, the retaining mesh to hold the acoustic foam within the acoustical baffle.

10. The information handling system of claim 9, the lens includes a spacer to extend through the acoustic foam and the retaining mesh, the spacer to provide a line-of-sight from the front panel of the baffle housing to a light emitting diode on a first cooling fan within the server chassis.

11. The information handling system of claim 9, the baffle housing further including:
a first tab within a first opening of the first side panel, the first tab to extend away from the front panel; and
a first hook at an end of the first tab opposite the front panel, the first hook to snap fit on the first panel of the server chassis to securely connect the acoustical baffle to the server chassis.

12. The information handling system of claim 11, the baffle housing further including:
a second tab within a second opening of the second side panel, the second tab to extend away from the front panel; and
a second hook at an end of the second tab opposite the front panel, the second hook to snap fit on the second panel of the server chassis to securely connect the acoustical baffle to the server chassis.

13. The information handling system of claim 12, wherein the first and second tabs and the first and second hooks enable the acoustical baffle a tool less attachment to and removal from the server chassis.

14. The information handling system of claim 9, the baffle housing includes a peg to be placed in physical contact with a catch of the lens, wherein the physical contact between the peg and the catch hold the lens within the channel of the front panel.

15. The information handling system of claim 9, the baffle housing includes a hook to be placed in physical contact with a retaining opening of the retaining mesh, wherein the physical contact between the hook and the retaining opening holds the retaining mesh a particular distance from the front panel.

16. The information handling system of claim 9, wherein the retaining mesh is a particular distance from the cooling fans when the acoustical baffle is connected to the server chassis, wherein the particular distance optimizes air flow within the server chassis.

17. An acoustical baffle comprising:
a baffle housing including a front panel having a channel, and first and second side panels, the first side panel to be placed in physical contact with a first panel of a server chassis, and the second side panel to be placed in physical contact with a second panel of the server chassis, the first side panel having:
a first tab within a first opening of the first side panel, the first tab to extend away from the front panel; and
a first hook at an end of the first tab opposite the front panel, the first hook to snap fit on the first panel of the server chassis to securely connect the acoustical baffle to the server chassis;
an acoustic foam in physical contact with the baffle housing, the acoustic foam including an acoustic surface to absorb noise generated by cooling fans within the server chassis;
a retaining mesh in physical contact with the acoustic foam, the retaining mesh to hold the acoustic foam within the acoustical baffle; and
a lens in physical contact with the baffle housing, the lens to fit within the channel of the front panel, the lens includes a spacer to extend through the acoustic foam and the retaining mesh, the spacer to provide a line-of-sight from the front panel of the baffle housing to a light emitting diode on a first cooling fan within the server chassis.

18. The acoustical baffle of claim 17, wherein the first and second tabs and the first and second hooks enable the acoustical baffle a tool less attachment to and removal from the server chassis.

19. The acoustical baffle of claim 17, the baffle housing includes a peg to be placed in physical contact with a catch of the lens, wherein the physical contact between the peg and the catch hold the lens within the channel of the front panel.

20. The acoustical baffle of claim 17, the baffle housing includes a hook to be placed in physical contact with a retaining opening of the retaining mesh, wherein the physical contact between the hook and the retaining opening holds the retaining mesh a particular distance from the front panel.

* * * * *